US009310443B2

(12) United States Patent
Shimizu et al.

(10) Patent No.: US 9,310,443 B2
(45) Date of Patent: Apr. 12, 2016

(54) VOLTAGE DETECTION APPARATUS AND METHOD OF REDUCING DISPERSION OF DARK CURRENTS

(75) Inventors: Hidehiko Shimizu, Shizuoka (JP); Kimihiro Matsuura, Shizuoka (JP); Yusuke Tatara, Saitama (JP); Shintaro Uchida, Saitama (JP); Takayuki Yamamoto, Saitama (JP)

(73) Assignees: YAZAKI CORPORATION, Tokyo (JP); HONDA MOTOR CO., LTD., Tokyo (JP)

( * ) Notice: Subject to any disclaimer, the term of this patent is extended or adjusted under 35 U.S.C. 154(b) by 172 days.

(21) Appl. No.: 13/984,227

(22) PCT Filed: Feb. 28, 2012

(86) PCT No.: PCT/JP2012/055503
§ 371 (c)(1),
(2), (4) Date: Aug. 7, 2013

(87) PCT Pub. No.: WO2012/118219
PCT Pub. Date: Sep. 7, 2012

(65) Prior Publication Data
US 2013/0328568 A1    Dec. 12, 2013

(30) Foreign Application Priority Data
Feb. 28, 2011  (JP) ................................ 2011-042868

(51) Int. Cl.
*G01N 27/416*  (2006.01)
*G01R 31/36*  (2006.01)
*H02J 7/00*  (2006.01)

(52) U.S. Cl.
CPC .......... *G01R 31/3658* (2013.01); *G01R 31/362* (2013.01); *H02J 7/0016* (2013.01)

(58) Field of Classification Search
USPC ........................................................ 324/434
See application file for complete search history.

(56) References Cited

U.S. PATENT DOCUMENTS

| 6,147,499 | A  | 11/2000 | Torii et al. |
| 2005/0242776 | A1 | 11/2005 | Emori et al. |
| 2006/0103349 | A1 | 5/2006 | Yamamoto |

(Continued)

FOREIGN PATENT DOCUMENTS

| CN | 1773767 A | 5/2006 |
| CN | 101803102 A | 8/2010 |

(Continued)

OTHER PUBLICATIONS

Chinese Office Action from Chinese Patent App. No. 2012800108570 (Nov. 24, 2014) with English language translation thereof.

(Continued)

*Primary Examiner* — Samuel Berhanu
(74) *Attorney, Agent, or Firm* — Kenealy Vaidya LLP

(57) ABSTRACT

A voltage detection apparatus includes a plurality of voltage detection units, each of which detects cell voltages of plural cells in each of blocks in a battery module. Each of blocks includes the plural cells connected in series. The plurality of voltage detection units are respectively supplied with power via power supply lines connected to the blocks. The plurality of voltage detection units are respectively provided with a plurality of current increase units for increasing dark currents so that the dark currents flowing through the power supply lines respectively become a same target value.

7 Claims, 8 Drawing Sheets

(56) References Cited

U.S. PATENT DOCUMENTS

| | | |
|---|---|---|
| 2010/0171503 A1 | 7/2010 | Fredette |
| 2010/0209748 A1* | 8/2010 | Kudo et al. .................... 429/91 |

FOREIGN PATENT DOCUMENTS

| | | |
|---|---|---|
| GB | 2 420 235 A | 5/2006 |
| JP | 11-113182 A | 4/1999 |
| JP | 11-233154 A | 8/1999 |
| JP | 2006-141148 A | 6/2006 |
| JP | 2008-148553 A | 6/2008 |
| JP | 2009-38876 A | 2/2009 |
| JP | 2010-193589 A | 9/2010 |
| WO | 2009/017009 A1 | 2/2009 |
| WO | 2009/038564 A1 | 3/2009 |

OTHER PUBLICATIONS

Office Action from Japanese Patent App. No. 2011-042868 (Nov. 4, 2014) with English language translation thereof.

International Search Report and Written Opinion of the International Search Report for PCT/JP2012/055503 dated Jul. 9, 2012.

Chinese Office Action from Chinese Patent App. No. 201280010857.0 (Feb. 16, 2016) with English language translation thereof.

\* cited by examiner ures of the related arts has a following problem. As described
VOLTAGE DETECTION APPARATUS AND METHOD OF REDUCING DISPERSION OF DARK CURRENTS This application is a U.S. national phase filing under 35 U.S.C. §371 of PCT Application No. PCT/JP2012/055503, filed Feb. 28, 2012, and which in turn claims priority under 35 U.S.C. §119 to Japanese Patent Application No. JP2011-042868, filed Feb. 28, 2011, the entireties of which are incorporated by reference herein.

TECHNICAL FIELD

The present invention relates to a voltage detection apparatus for detecting a cell voltage at each block in a battery module which is divided into plural blocks each configured to include plural cells connected in series, and also relates to a method of reducing the dispersion of dark currents.

BACKGROUND ART

Conventionally, a battery assembly (battery module) formed by coupling in series plural unit cells each formed by a secondary battery is divided into plural blocks each including a plurality of the cells, and a voltage detection apparatus includes a plurality of voltage detection units each detecting the cell voltage at each block (see FIG. 1).

FIG. 8 is a diagram showing the configuration of a voltage detection unit of a related art. The voltage detection unit 100 is configured by a high-voltage side circuit 110 and a low-voltage side circuit 120. The high-voltage side circuit is connected to a block 150 formed by secondary batteries and is supplied with power from the block 150 via a power supply line 155. The low-voltage side circuit is connected to an ignition switch 141 and is supplied with power via the ignition switch 141.

The high-voltage side circuit 110 is provided with a voltage detection circuit 111, a 5 volt power supply circuit 112, a logic circuit 113 and an insulation communication IC 114. The low-voltage side circuit 120 is provided with a 5 volt power supply circuit 121, a CPU 122 and an interface (I/F) 123.

In a turned-on state of the ignition switch 141, in the low-voltage side circuit 120, the CPU 122 driven by the 5 volt power supply circuit 121 instructs the detection of the voltage of each of the cells within the block 150 via the insulation communication IC 114. In the high-voltage side circuit 110, the voltage detection circuit 111 detects the voltage of each of the cells within the block 150 in accordance with the instruction.

When the ignition switch 141 is turned off and the power supply is interrupted, in the low-voltage side circuit 120, a value of a current (dark current) flowing through the ignition switch 141 becomes 0. Simultaneously, the high-voltage side circuit 110 also shifts to a sleep state.

As the related art of this kind, a PTL (patent literature) 1 discloses that a secondary battery having a large voltage reduction ratio is connected to a cell control circuit having a small dark current, whilst a secondary battery having a small voltage reduction ratio is connected to a cell control circuit having a large dark current, whereby the voltage reduction ratio of each of the secondary batteries is absorbed by the voltage reduction ratios of the dark currents of the cell control circuits to thereby reduce the degree of the dispersion.

A PTL 2 discloses that control power supplies are respectively connected between power supply input terminals and ground terminals in a state that differential amplifiers are divided into groups and the groups are insulated from each other, to thereby reduce the degree of the dispersion of dark currents.

A PTL 3 discloses that battery cells as one unit are controlled by a cell monitoring IC chip and a control IC chip as a pair.

CITATION LIST

Patent Literature

[PTL 1] JP-A-2002-199601
[PTL 2] JP-A-11-113182
[PTL 3] JP-A-2008-148553

SUMMARY OF INVENTION

Technical Problem

However, each of the aforesaid voltage detection apparatuses of the related arts has a following problem. As described above, when the ignition switch is turned off, the high-voltage side circuit also shifts to the sleep state. In this case, a current (dark current) of a small amount flows from the secondary battery due to the leak currents of the respective elements within the high-voltage side circuit or the operation current of a part of the circuit within the high-voltage side circuit. Since this dark current differs at every voltage detection unit, the voltages of the respective blocks of the secondary batteries disperse when the sleep state continues for a long time.

This invention has been made in view of the aforesaid circumstance of the related arts and an object of this invention is to provide a voltage detection apparatus and a method of reducing the dispersion of dark currents each of which can reduce the degree of the dispersion of dark currents among voltage detection units and suppress the dispersion of the voltages among respective blocks to a small degree even when a sleep state continues for a long time.

Solution to Problem

In order to achieve the above object, according to the present invention, there is provided a voltage detection apparatus, comprising:

a plurality of voltage detection units, each of which detects cell voltages of plural cells in each of blocks in a battery module, the each of blocks including the plural cells connected in series, wherein the plurality of voltage detection units are respectively supplied with power via power supply lines connected to the blocks; and wherein the plurality of voltage detection units are respectively provided with a plurality of current increase units for increasing dark currents so that the dark currents flowing through the power supply lines respectively become a same target value.

Thus, the degree of the dispersion of dark currents among voltage detection units can be reduced and the dispersion of the voltages among respective blocks can be suppressed to a small degree even when a sleep state continues for a long time.

Preferably, each of the current increase units is a resistor which has one end and the other end, one end of the resistor is connected to the power supply line connected to one end of the corresponding block, and the other end of the resistor is held to the same voltage as that of the other end of the corresponding block. Thus, the dark currents can be increased easily.

Preferably, each of the voltage detection units includes a constant voltage power supply circuit, each of the current increase units is a resistor which has one end and the other end, the one end of the resistor is connected to an output terminal of the constant voltage power supply circuit, and the other end of the resistor is held to a predetermined voltage. Thus, the value of the dark current flowing through the dark current adjustment resistor becomes constant and stabilized even when the voltage of the block varies.

Preferably, the resistor is a variable resistor whose resistance value is adjustable. Thus, the adjustment procedure of the dark current can be performed easily.

Preferably, the voltage detection apparatus further comprising:
a dark current adjustment unit that adjusts the dark currents flowing through the plurality of voltage detection units,
wherein the dark current adjustment unit includes:
a plurality of current detection units which respectively detect the dark currents flowing through the plurality of voltage detection units;
a target value setting unit which sets a target value based on the dark currents detected by the plurality of current detection units; and
a current control unit which controls the plurality of current increase units so that each of the dark currents flowing through the plurality of voltage detection units becomes the target value. Thus, since the dark current values can be adjusted automatically at an arbitrary timing without human assistance, the dispersion of the dark currents among the respective blocks can be suppressed to a small degree.

Preferably, the target value is set to a maximum value of the dark current in the case of not providing the current increase unit or a value exceeding the maximum value. Thus, the dark currents of the respective voltage detection units can be surely set to the same target value.

According to the present invention, there is also provided a method of reducing the dispersion of dark currents flowing through a plurality of voltage detection units each of which detecting cell voltages of plural cells in each of blocks in a battery module, the each of blocks including the plural cells connected in series, the method comprising:
detecting the dark currents flowing through the plurality of voltage detection units which are respectively supplied with power via power supply lines connected to the blocks;
setting a target value based on the detected dark currents; and
adjusting the dark currents flowing through the plurality of voltage detection units by a plurality of current increase units respectively provided in the plurality of voltage detection units for increasing the dark currents flowing through the plurality of voltage detection units so that the dark currents flowing through the power supply lines become a same target value. Thus, the degree of the dispersion of the dark currents among the respective voltage detection units can be reduced and the dispersion of the voltages among respective blocks can be suppressed to a small degree even when a sleep state continues for a long time.

Advantageous Effects of Invention

According to this invention, since the plurality of voltage detection units are respectively provided with the plurality of current increase units for increasing the dark currents so that each of dark currents flowing through the power supply lines becomes the same target value. Thus, the degree of the dispersion of dark currents among voltage detection units can be reduced and the dispersion of the voltages among respective blocks can be suppressed to a small degree even when a sleep state continues for a long time.

DESCRIPTION OF EMBODIMENTS

A voltage detection apparatus and a method of reducing the dispersion of dark currents according to embodiments of this invention will be explained with reference to drawings.

First Embodiment

Figure 1:
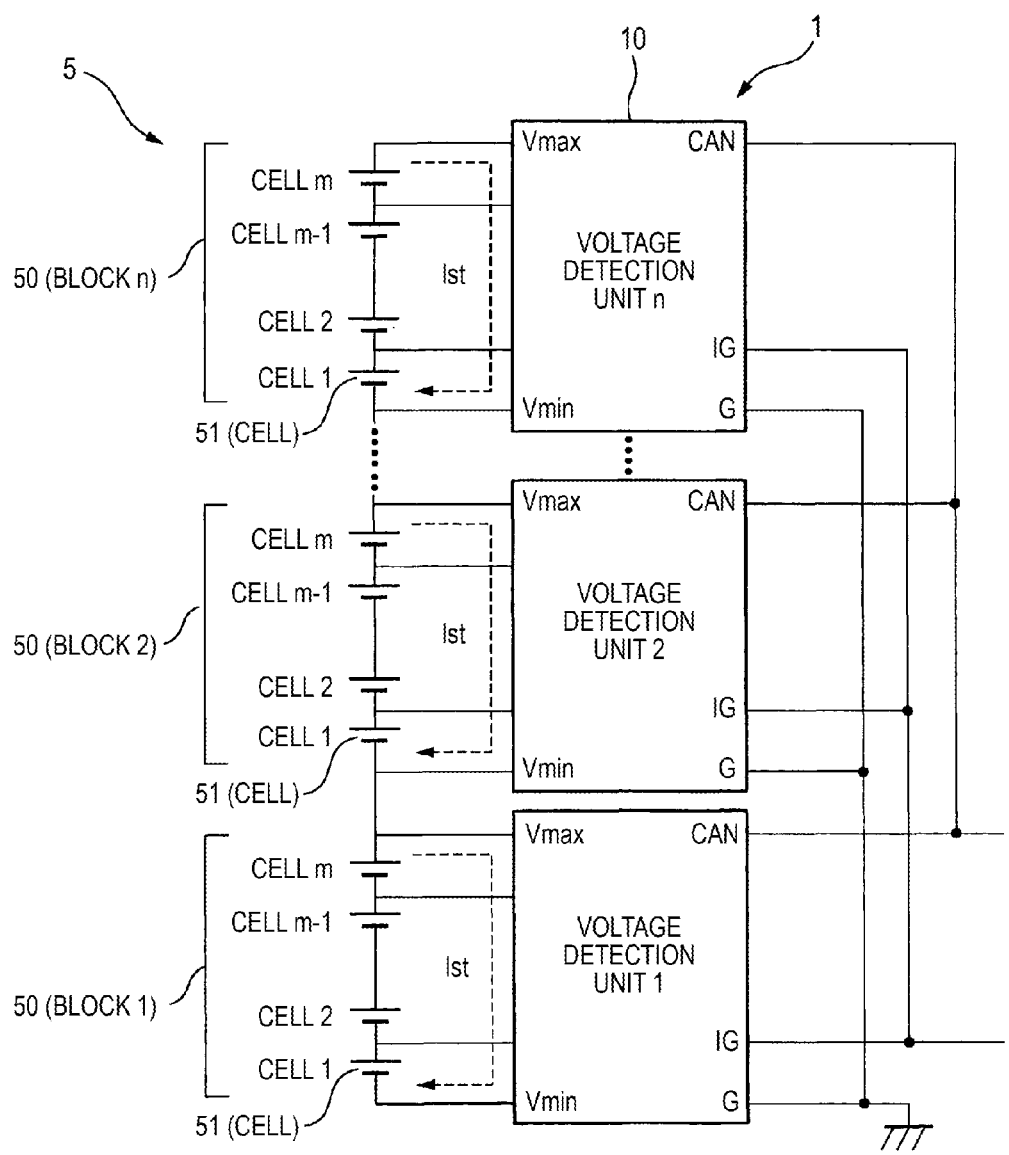
FIG. 1 is a diagram showing the configuration of a voltage detection apparatus according to the first embodiment.

FIG. 1 is a diagram showing the configuration of the voltage detection apparatus according to the first embodiment.

A battery module 5 is an aggregation formed by a plurality of cell blocks 50 (n blocks from block 1 to block n in FIG. 1) connected in series each formed by a plurality of unit cells (m cells from cell 1 to cell m in FIG. 1) each as a secondary battery.

A voltage detection apparatus 1 includes a plurality of voltage detection units 10 corresponding to the plurality of cell blocks 50, respectively. The voltage detection unit 10 detects the voltage (cell voltage) of each of cells 51 within the block 50. In the first embodiment of FIG. 1, although each of the blocks 50 is configured to include m cells, this invention can be realized even if the numbers of the cells within the respective blocks 50 differ.

Figure 2:
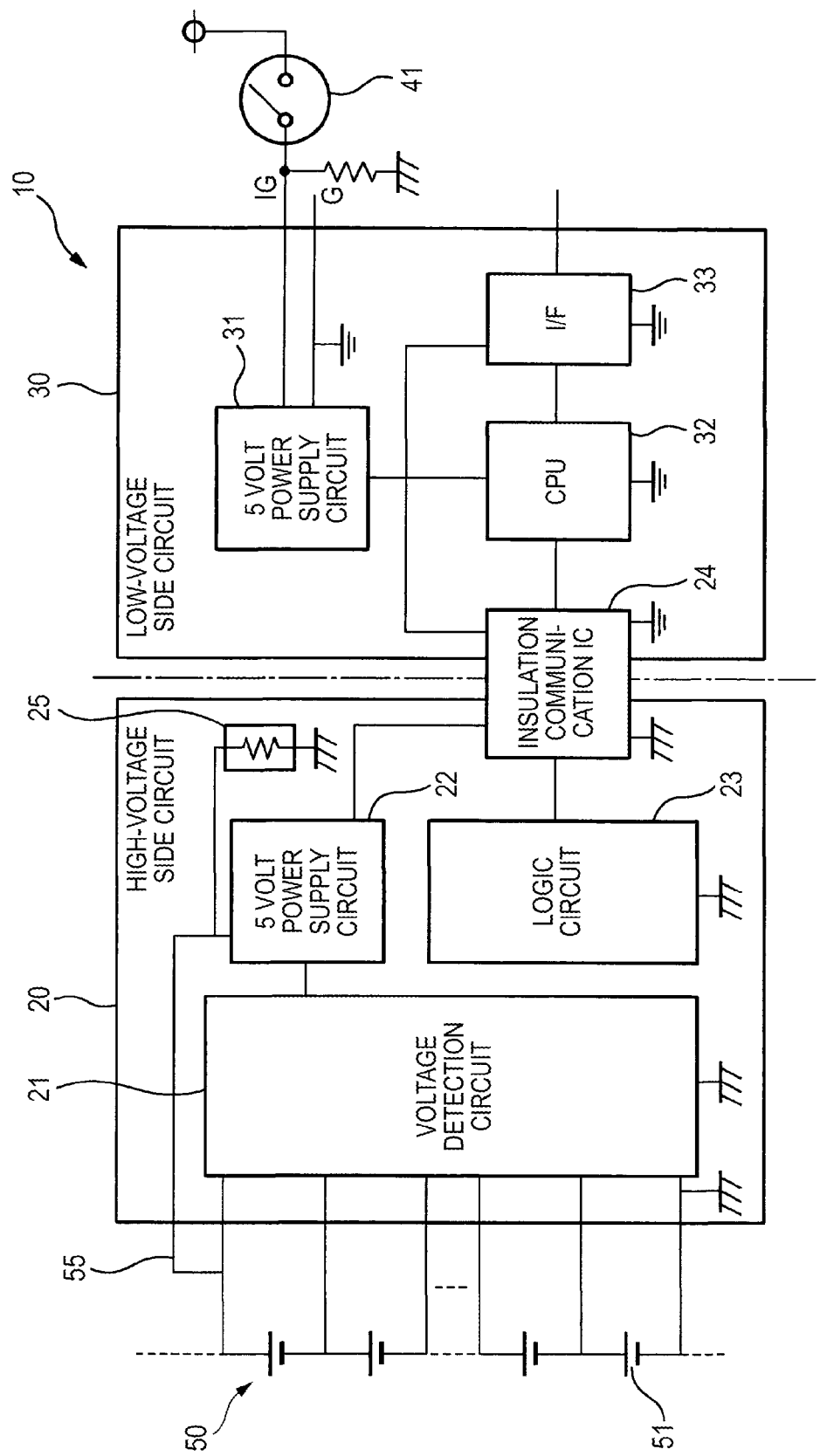
FIG. 2 is a diagram showing the configuration of a voltage detection unit.

FIG. 2 is a diagram showing the configuration of the voltage detection unit. The voltage detection unit 10 is configured by a high-voltage side circuit 20 and a low-voltage side circuit 30. The high-voltage side circuit is connected to the block 50 and is supplied with power from the block 50 via a power supply line 55. The low-voltage side circuit is connected to an ignition switch 41 and is supplied with power from a power supply via the ignition switch 41.

The high-voltage side circuit 20 is provided with a voltage detection circuit 21, a 5 volt power supply circuit 22, a logic circuit 23 and an insulation communication IC 24. The low-voltage side circuit 30 is provided with a 5 volt power supply circuit 31, a CPU 32 and an interface (I/F) 33. Communication between the high-voltage side circuit 20 and the low-voltage side circuit 30 is performed via the insulation communication IC 24.

The high-voltage side circuit 20 is provided with a dark current adjustment resistor 25 which one end is connected to the power supply line 55, that is connected from the block 50 to the high-voltage side circuit 20, and which the other end is grounded. As described later, the dark current adjustment resistor 25 (current increase unit) acts to adjust (increase) a dark current of the voltage detection unit 10, that is, a dark current flowing into the high-voltage side circuit 20 from the block 50. In this embodiment, the dark current adjustment resistor is formed by a fixed resistor having a constant resistance value.

This dark current adjustment resistor may be attached to the high-voltage side circuit 20 so as to be exchangeable freely or may be fixed thereto.

Further, a semi-fixed resistor which resistance value can be changed freely by a worker may be provided in place of the fixed resistor.

When the ignition switch 41 is turned on, in the low-voltage side circuit 30, the CPU 32 driven by the 5 volt power supply circuit 31 instructs on the high-voltage side circuit 20 side via the insulation communication IC 24 to detect the voltage of each of the cells within the block 50. The high-voltage side circuit 20 detects the voltage of each of the cells within the block in accordance with the instruction.

The voltage detection circuit 21 has a plurality of A/D converters (not shown) connected to the plurality of cells, respectively. The voltage detection circuit converts the cell voltages thus converted by the A/D converters into digital values and outputs. The cell voltages thus outputted from the voltage detection circuit 21 are read by the CPU 32 via the logic circuit 23 and the insulation communication IC 24 and then outputted to the outside via the interface 33.

On the other hand, when the ignition switch 41 is turned off and the power supply to the low-voltage side circuit 30 is interrupted, in the low-voltage side circuit 30, since the current does not flow through the ignition switch 41, the dark current value becomes 0. When the low-voltage side circuit 30 is placed in a sleep state, the high-voltage side circuit 20 is also shifted to the sleep state.

Figure 3:
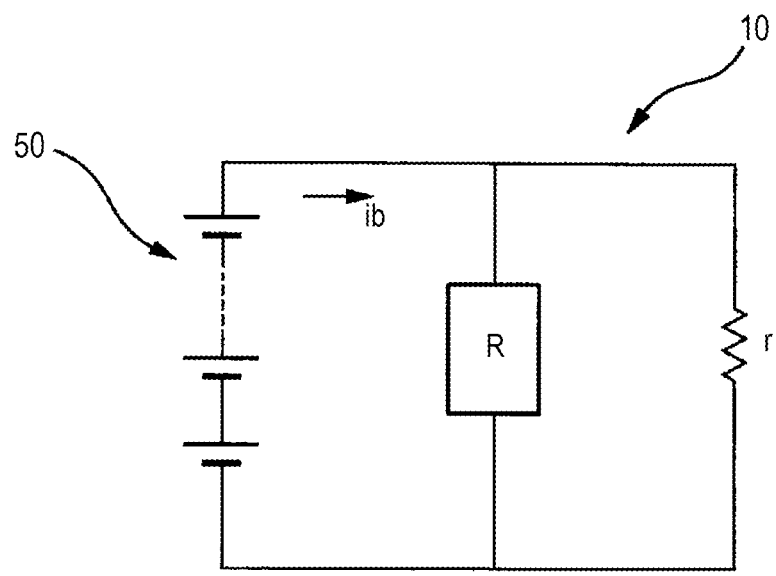
FIG. 3 is a diagram showing the equivalent circuit of the voltage detection unit where a dark current flows from a block when a high-voltage side circuit shifts to a sleep state.

FIG. 3 is a diagram showing the equivalent circuit of the voltage detection unit in a state where the dark current flows from the block when the high-voltage side circuit shifts to the sleep state. In the figure, R depicts a DC resistance of the voltage detection unit 10 except for the dark current adjustment resistor 25 and r depicts a resistance of the dark current adjustment resistor 25. In the voltage detection unit 10, the dark current ib flows from the block 50 via the DC resistor R and the resistor r connected in parallel, in the sleep state. Although the current flowing through the DC resistor R disperses among the respective voltage detection units, it is possible to make the dark current ib, which is a sum of the current flowing through the DC resistor R and the current flowing through the resistor r, constant by changing the value of the resistor r.

Figure 4A:
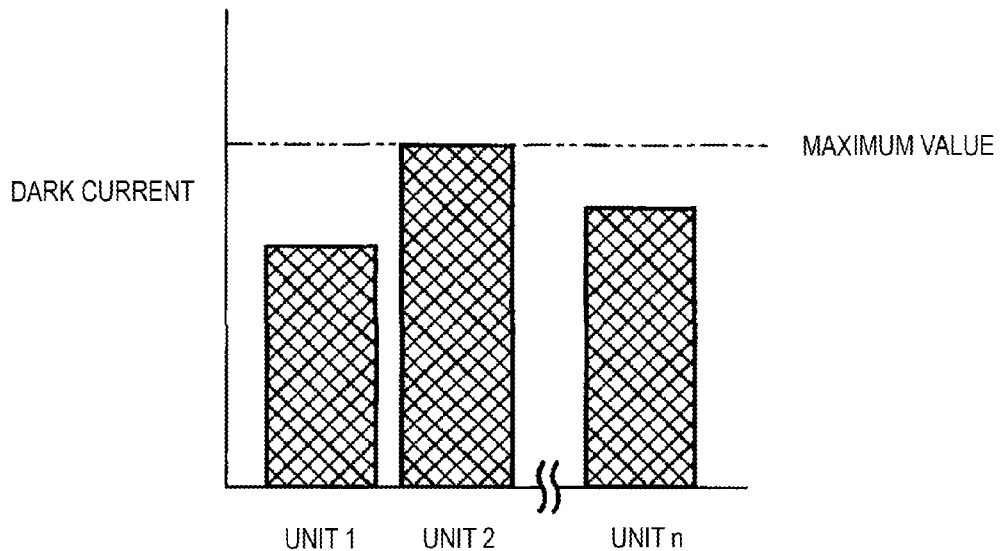
FIGS. 4A and 4B are graphs showing the magnitudes of the dark currents corresponding to the respective voltage detection units.
Figure 4B:
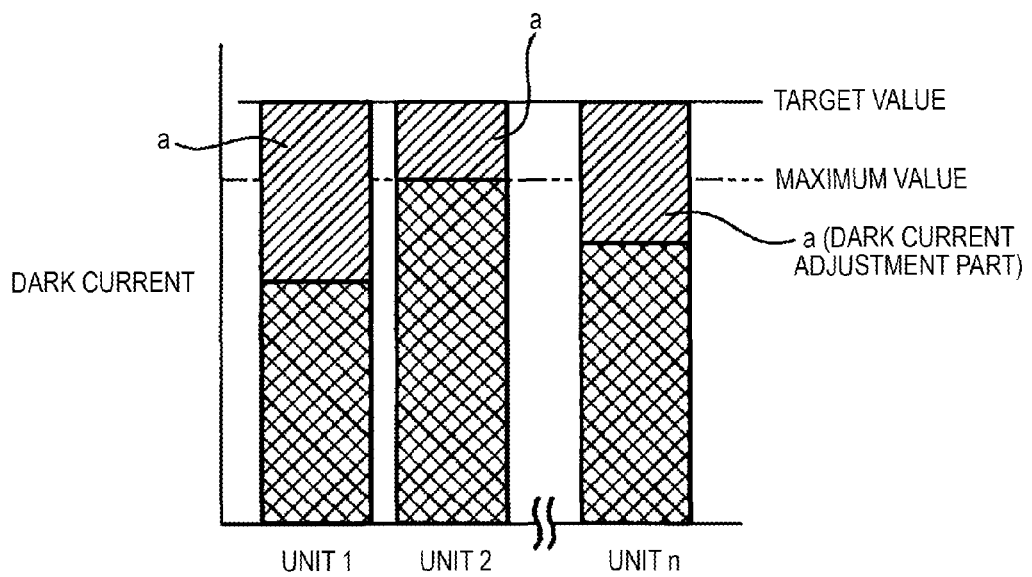

Next, the setting of the dark current adjustment resistor 25 to be attached within the voltage detection unit 10 will be shown. FIGS. 4A and 4B are graphs showing the magnitudes of the dark currents corresponding to the respective voltage detection units. When the dark current adjustment resistors 25 are not provided, the dark currents flowing in the voltage detection units 10 (units 1, 2, . . . n) disperse as shown in FIG. 4A.

In this embodiment, as shown in FIG. 4B, the target value of the dark current is set so as to be slightly larger than the maximum value of the dark current shown in FIG. 4A. That is, the resistance values of the dark current adjustment resistors 25 are respectively set to different values so that the dark currents flow more by amounts corresponding to the increases of the dark currents (slanted areas a in the figure) in the respective voltage detection units 10 (1, 2, . . . n). Thus, the dark current values become the same in all the voltage detection units 10 (1, 2, . . . n). Although the target value of the dark current is set to the value slightly larger than the maximum value so that the target value does not change even if the maximum value of the dark current slightly varies, each of the respective target values may be set to the maximum value.

In this manner, according to the voltage detection apparatus of the first embodiment, although the absolute value of the dark current becomes slightly larger in the high-voltage side circuit 20, the values of the dark currents become same in all the voltage detection units 10. Thus, the dispersion of the dark currents among the respective voltage detection units, and hence the dispersion of the voltages among the respective blocks can be suppressed to a small degree even when the sleep state continues for a long time.

Further, the relative dispersion of the dark currents among the respective units can be suppressed to a small degree with respect to the temperature change of the voltage detection unit group constituting the voltage detection units 1 to n or the variation of the cells.

Further, since the resistor, which one end is connected to the power supply line connected to the one end of the block and which the other end is held to the same voltage as that of the other end of this block, is used as the dark current adjustment resistor, the dark current can be increased easily. When the dark current adjustment resistor is the variable resistor which resistance value can be changed freely, the adjustment procedure of the dark current can be performed easily. Furthermore, since the target value is set to the maximum value of the dark current in the case of not providing the dark current adjustment resistor or the value exceeding the maximum value, the dark currents of the respective voltage detection units can be surely set to the same target value.

Second Embodiment

Although the first embodiment shows the case that the dark current adjustment resistor is connected to the power supply line of the block, the second embodiment shows a case that the dark current adjustment resistor is connected to the output line of a 5 volt power supply circuit (constant voltage power supply circuit).

Figure 5:
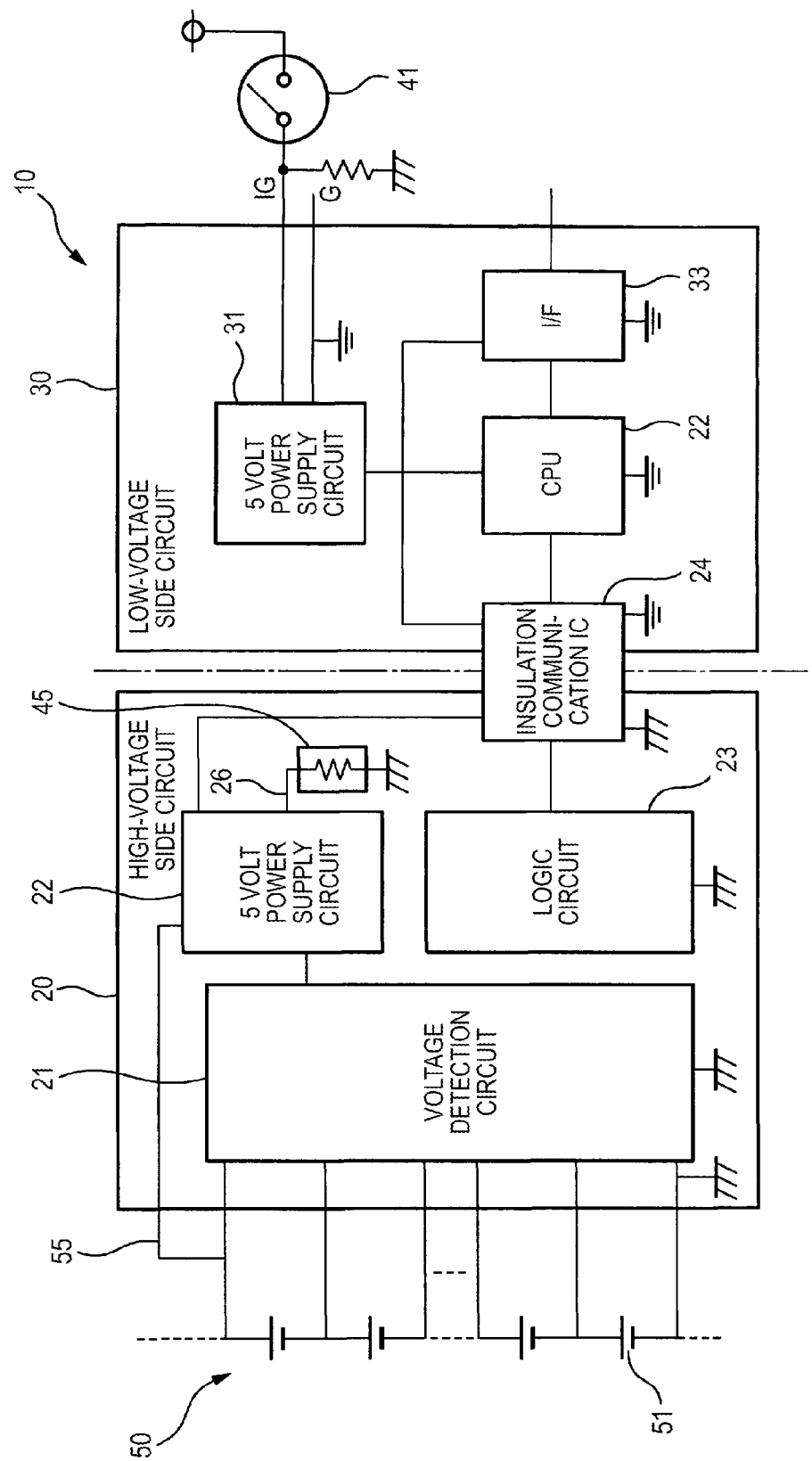
FIG. 5 is a diagram showing the configuration of the voltage detection unit of the second embodiment.

FIG. 5 is a diagram showing the configuration of the voltage detection unit 10 of the second embodiment. In this embodiment, constituent elements identical to those of the first embodiment are referred to by the common symbols, with explanation thereof being omitted. In the second embodiment, as explained above, the one end of a dark current adjustment resistor 45 is connected to the output line 26 of the 5 volt power supply circuit 22 and the other end thereof is grounded and held at a predetermined voltage (GND). Like the first embodiment, in this embodiment, the dark current adjustment resistor 45 may be provided so as to be exchangeable freely and may be a fixed resistor or a semi-fixed resistor.

In this case, since the dark current adjustment resistor 45 is applied with a constant voltage of 5 volt, a constant current, that is, the dark current of a constant value flows.

According to the voltage detection apparatus of the second embodiment, the value of the dark current flowing through the dark current adjustment resistor becomes constant and hence stabilized irrespective of the dispersion of the voltages among the respective blocks.

Third Embodiment

Although each of the first and second embodiments shows the case that, for example, a worker adjusts the dark current by using the dark current adjustment resistor at the time of shipping from a factory or performing maintenance, the third embodiment shows a case that the adjustment of the dark current is performed automatically at an arbitrary timing. As compared with each of the first and second embodiments, the third embodiment is added with a current measurement part and a dark current adjustment device. Further, the kind of the dark current adjustment resistor differs from those of the first and second embodiments.

Figure 6:
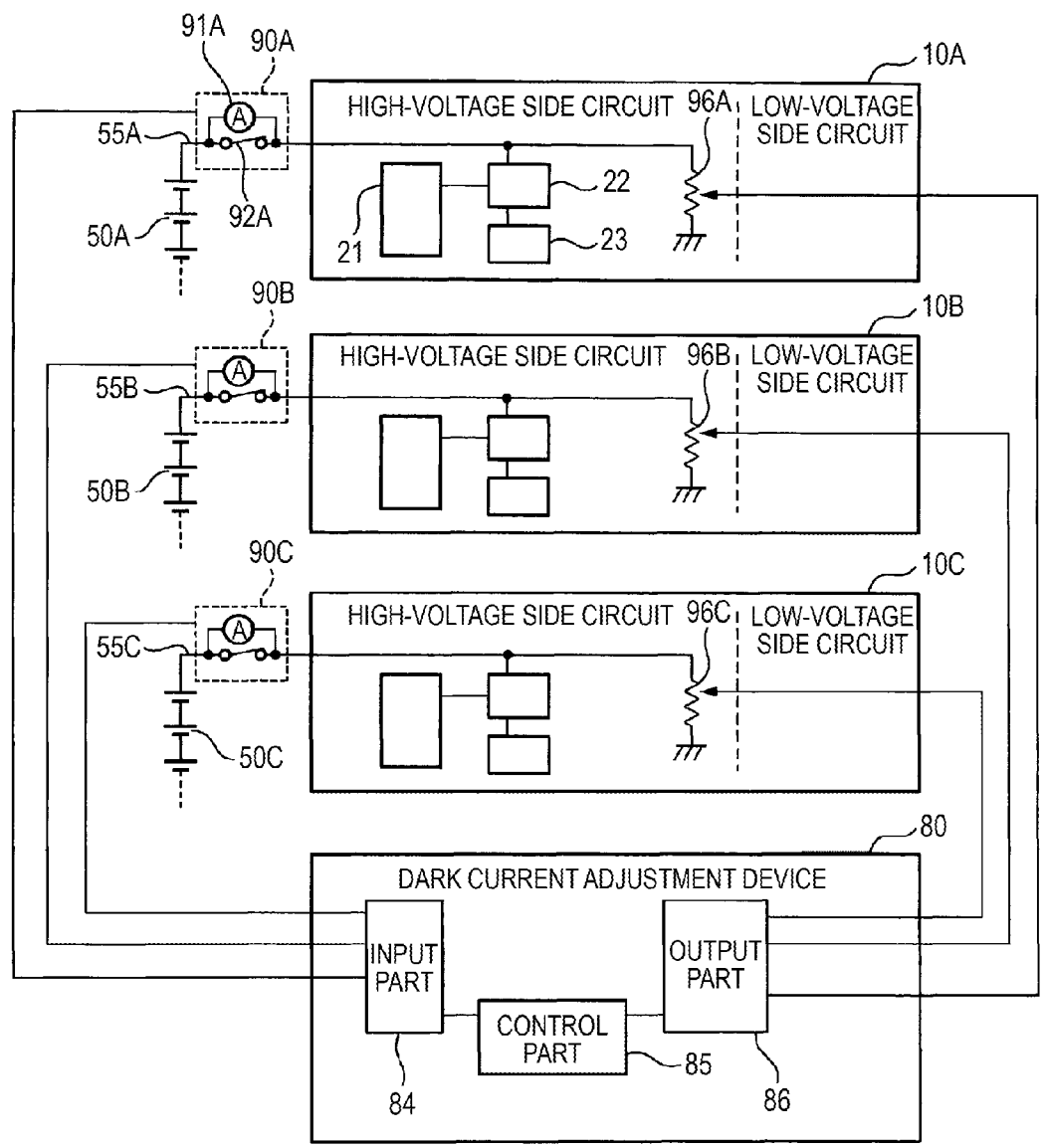
FIG. 6 is a diagram showing the configuration of the voltage detection apparatus of the third embodiment.

FIG. 6 is a diagram showing the configuration of the voltage detection apparatus of the third embodiment. In the case of distinguishing the voltage detection units at each block, suffixes A, B, C are added to the symbols of the respective voltage detection units so as to be referred to 10A, 10B, 10C. In contrast, when it is not necessary to distinguish the voltage detection units at each block, each of the respective voltage detection units is commonly referred to the voltage detection unit 10. This is applied to each of the other constituent elements. In this embodiment, constituent elements identical to those of the first embodiment are referred to by the common symbols, with explanation thereof being omitted. A part of the constituent elements such as the low-voltage side circuit is omitted in this figure so as to simplify and clarify the explanation.

The power supply lines 55 (55A, 55B, 55C) connected from the respective blocks 50 to the respective voltage detection units 10 are provided with the current measurement parts 90 (90A, 90B, 90C) each capable of measuring the dark current, respectively.

The current measurement part 90 is configured by an ampere meter 91 and a switch 92 connected in parallel on the way of the power supply line 55. In the current measurement part 90, when the switch 92 is in a turned-on state, the power supply line 55 is directly connected to the voltage detection unit 10 from the block 50. On the other hand, when the switch 92 is in a turned-off state, since the power supply line 55 is connected to the voltage detection unit 10 from the block 50 via the ampere meter 91, the dark current can be measured. The current measurement part 90 is connected to a dark current adjustment device 80.

The dark current adjustment device 80 is configured by an input part 84 for inputting dark current values from the current measurement parts 90, a control part 85 for setting a target value from the dark current values in the respective voltage detection units 10, and an output part 86 for outputting, to dark current adjustment resistors 96 described later, signals for changing resistance values thereof. The control part 85 contains well-known CPU, ROM, RAM etc.

The high-voltage side circuit 20 of the voltage detection unit 10 is provided with the dark current adjustment resistor 96 which one end is connected to the power supply line 55 and the other end is grounded. As the dark current adjustment resistor 96, a voltage control type variable resistor or a digital potentiometer which resistance value can be changed freely according to the signal from the dark current adjustment device 80 is used.

Figure 7:
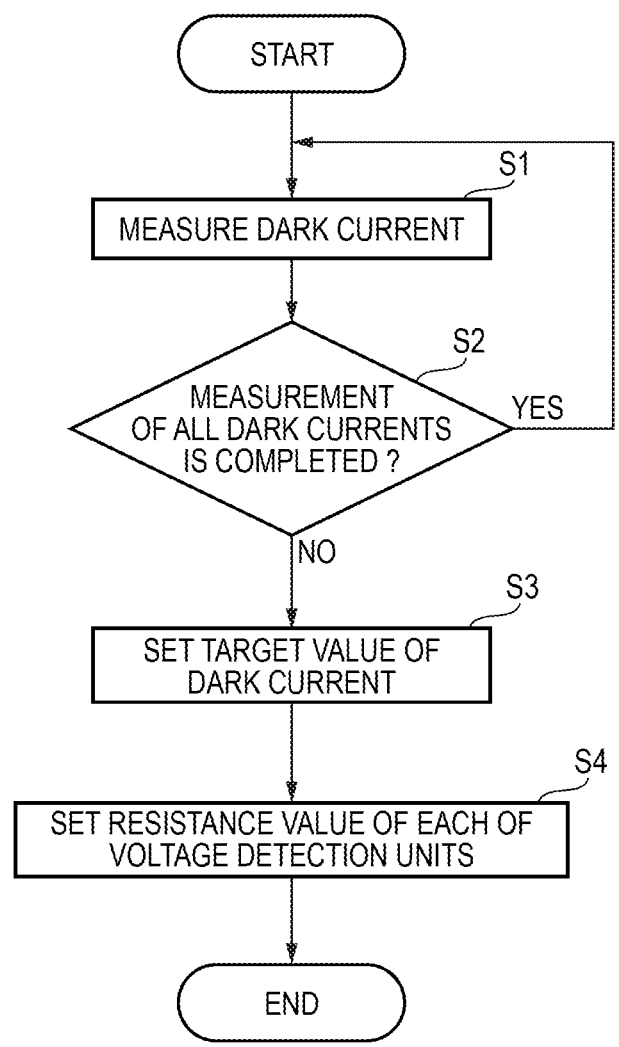
FIG. 7 is a flowchart showing the adjustment operation of the dark current in a dark current adjustment device
Figure 8:
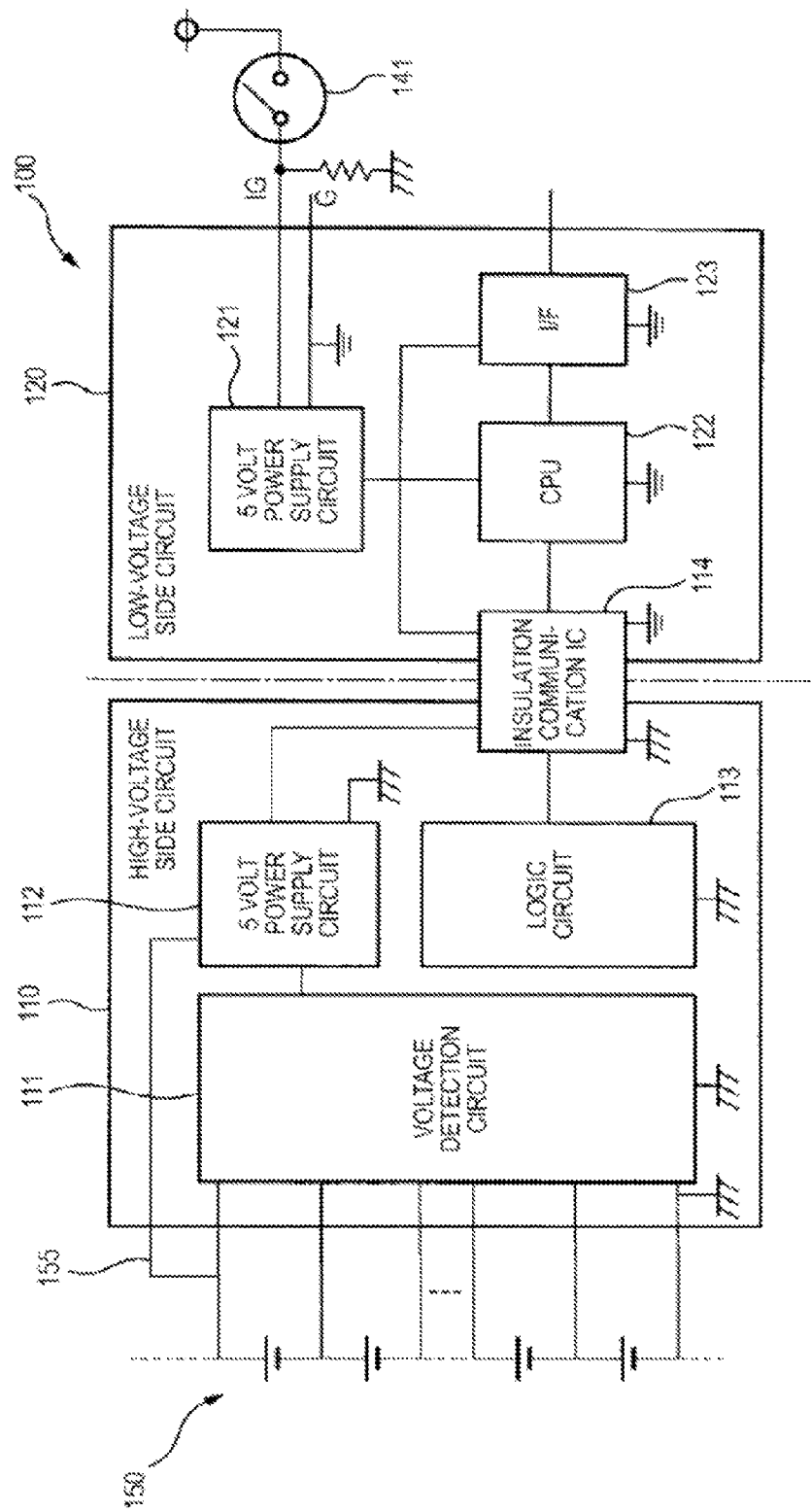
FIG. 8 is a diagram showing the configuration of a voltage detection unit of a related art.

FIG. 7 is a flowchart showing the adjustment operation of the dark currents in the dark current adjustment device 80. This operation program is stored in the ROM within the control part 85 of the dark current adjustment device 80 and is executed by the CPU. This operation is performed in a state that the ignition switch 41 is turned off and hence the measurement of the dark current is possible.

First, the dark current adjustment device 80 measures a value of the dark current of the voltage detection unit 10A (step S1). At the time of performing this measurement, the dark current adjustment device 80 changes the switch 92A into an off-state from an on-state and obtains the current value measured by the ampere meter 91A via the input part 84.

The dark current adjustment device 80 determines whether or not the measurement of the dark current values of all the voltage detection units 10 is completed (step S2). When the measurement of the dark current values of all the voltage detection units 10 is not completed yet, the dark current adjustment device 80 returns its processing to step S1 and measures the dark current value of the next voltage detection unit 10B.

On the other hand, when the measurement of the dark current values of all the voltage detection units 10 is completed, the dark current adjustment device 80 sets the target value of the dark current (step S3). The processing of step S3 corresponds to a target value setting unit. At the time of setting the target value, the dark current adjustment device 80 selects the maximum value from the dark current values of all the voltage detection units 10, then adds a value α to the maximum value and sets the added value as the target value of the dark currents. This value α is desirably a small value as compared with the maximum value of the dark current so that all the dark current values can be set to the same target value even when the maximum values of the dark currents vary. The value α may be 0.

The dark current adjustment device 80 outputs signals for setting to the target value to the voltage detection units 10A, 10B, 10C via the output part 86, respectively (step S4). The resistance values of the dark current adjustment resistors 96A, 96B, 96C are respectively changed in accordance with the signals to thereby set all the dark current values of the voltage detection units 10A, 10B, 10C to the target value. The processing of step S4 corresponds to a current control unit. Thereafter, the dark current adjustment device 80 completes this operation. Thus, even if the dark current values of the respective voltage detection units measured periodically or at an arbitral timing vary with the time lapse, the dark current values are changed to the target value which is set at an arbitrary timing.

According to the voltage detection apparatus of the third embodiment, the dark current values of the voltage detection units, which are supplied with power from the respective blocks, can be set to the same value by using the dark current adjustment device. Thus, since the dark current values can be arbitrarily adjusted automatically without human assistance, the dispersion of the dark currents among the respective voltage detection units can be suppressed to a small degree.

This invention is not limited to the configurations of the aforesaid embodiments, and any configuration may be suitably applied to the invention so long as it can realize the functions recited in claims or the functions of the configurations of the aforesaid embodiments.

For example, in the third embodiment, although the dark current adjustment resistor is connected to the power supply line from the block like the first embodiment, the dark current adjustment resistor may be connected to the output line of the 5 volt power supply circuit like the second embodiment. In that case, since the constant current flows into the dark current adjustment resistor, the value of the dark current becomes constant and hence stabilized.

Further, the dark current adjustment device of the third embodiment may be attached to the voltage detection apparatus and may be detached therefrom after performing the adjustment of the dark current, at the time of shipping from a factory or performing maintenance.

Further, although the aforesaid embodiments show the case that the resistor serving as the current increase unit is connected to the power supply line, a constant current source such as a constant current diode may be connected in place of the resistor. In this case, also the dark current can be stabilized.

Furthermore, although the aforesaid embodiments show the case that the voltage is detected at each of the blocks which are formed by dividing the cells each so as to include a plurality of the cells connected in series, this invention is also applicable in the similar manner to a case where the voltage is detected at each cell, that is, a unit cell.

Furthermore, although the above embodiments show the case that each of the resistors of the plural voltage detection units is connected in the same manner, the coupling states of the respective resistors may be mixed in a manner that a part of the resistors of the plural voltage detection units are connected to the power supply lines and the remaining resistors of the plural voltage detection units are connected to the 5 volt power supply circuits.

The present application is based on Japanese Patent Application No. 2011-042868 filed on Feb. 28, 2011, the contents of which are incorporated herein by reference.

INDUSTRIAL APPLICABILITY

In the case of detecting the cell voltage at each block in the battery module which is divided into plural blocks each configured to include plural cells connected in series, this invention is useful since the dispersion of the voltages among respective blocks can be suppressed to a small degree even when the sleep state of the voltage detection units continues for a long time.

REFERENCE SIGNS LIST 1 voltage detection apparatus
5 battery module
10 voltage detection unit
20 high-voltage side circuit
21 voltage detection circuit
22 5 volt power supply circuit
23 logic circuit
24 insulation communication IC
25 dark current adjustment resistor
30 low-voltage side circuit
31 5 volt power supply circuit
32 CPU
33 interface (I/F)
45 dark current adjustment resistor
50 block
51 cell
55 power supply line
80 dark current adjustment device
84 input part
85 control part
86 output part
90 current measurement part
91 ampere meter
92 switch
96 dark current adjustment resistor

The invention claimed is:

1. A voltage detection apparatus, comprising:
a plurality of voltage detection units, each of which detects cell voltages of plural cells in each of blocks in a battery module, the each of blocks including the plural cells connected in series;
a plurality of power supply circuits, to which power is supplied via power supply lines connected to the blocks respectively;
a dark current adjustment unit that adjusts dark currents respectively flowing through the plurality of power supply lines;
a plurality of current increase units that increases the dark currents so that the dark currents respectively flowing through the power supply lines from the blocks when the voltage detection apparatus is in a sleep state become a same target value; and
a plurality of current detection units which respectively detect the dark currents flowing through the plurality of power supply lines,
wherein the plurality of voltage detection units are respectively supplied with the power from the plurality of power supply circuit via the power supply lines; and
wherein the dark current adjustment unit includes:
a target value setting unit which sets the target value based on the dark currents detected by the plurality of current detection units; and
a current control unit which changes resistance values of the plurality of current increase units so that each of the dark currents flowing through the plurality of power supply lines becomes the target value.

2. The voltage detection apparatus according to claim 1, wherein each of the current increase units is a resistor which has one end and the other end;
wherein one end of the resistor is connected to the power supply line connected to one end of the corresponding block; and
wherein the other end of the resistor is held to the same voltage as that of the other end of the corresponding block.

3. The voltage detection apparatus according to claim 2, wherein the resistor is a variable resistor whose resistance value is adjustable.

4. The voltage detection apparatus according to claim 1, wherein each of the voltage detection units includes a constant voltage power supply circuit;
wherein each of the current increase units is a resistor which has one end and the other end;
wherein the one end of the resistor is connected to an output terminal of the constant voltage power supply circuit; and
wherein the other end of the resistor is held to a predetermined voltage.

5. The voltage detection apparatus according to claim 4, wherein the resistor is a variable resistor whose resistance value is adjustable.

6. The voltage detection apparatus according to claim 1, wherein the target value is set to a maximum value of the dark current in the case of not providing the current increase unit or a value exceeding the maximum value.

7. A method of reducing the dispersion of dark currents flowing through a plurality of voltage detection units each of which detecting cell voltages of plural cells in each of blocks in a battery module, the each of blocks including the plural cells connected in series, the method comprising:
detecting the dark currents flowing through the plurality of voltage detection units which are respectively supplied with power via power supply lines connected to the blocks;
setting a target value based on the detected dark currents;
adjusting the dark currents flowing through the plurality of voltage detection units by a plurality of current increase units respectively provided in the plurality of voltage detection units for increasing the dark currents flowing through the plurality of voltage detection units so that the dark currents flowing through the power supply lines when the voltage detection apparatus is in a sleep state become the target value; and changing resistance values of the plurality of current increase units so that each of the dark currents flowing through the plurality of power supply lines becomes the target value.

* * * * *